(12) United States Patent
Parker et al.

(10) Patent No.: US 9,997,396 B2
(45) Date of Patent: Jun. 12, 2018

(54) DEEP TRENCH ISOLATION STRUCTURE AND METHOD FOR IMPROVED PRODUCT YIELD

(71) Applicant: Newport Fab, LLC, Newport Beach, CA (US)

(72) Inventors: George E. Parker, Irvine, CA (US); Dieter Dornisch, Carlsbad, CA (US); Lawrence L. Au, Laguna Hills, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days. days.

(21) Appl. No.: 14/686,074

(22) Filed: Apr. 14, 2015

(65) Prior Publication Data
US 2015/0340267 A1   Nov. 26, 2015

Related U.S. Application Data

(60) Provisional application No. 62/001,537, filed on May 21, 2014.

(51) Int. Cl.
*H01L 21/763*   (2006.01)
*H01L 21/762*   (2006.01)
*H01L 29/735*   (2006.01)

(52) U.S. Cl.
CPC ......... *H01L 21/763* (2013.01); *H01L 21/762* (2013.01); *H01L 21/76224* (2013.01); *H01L 29/735* (2013.01)

(58) Field of Classification Search
CPC . H01L 21/763; H01L 21/762; H01L 21/3105; H01L 21/31055; H01L 21/76224
See application file for complete search history.

(56) References Cited

U.S. PATENT DOCUMENTS

| | | | | |
|---|---|---|---|---|
| 4,454,647 | A * | 6/1984 | Joy | H01L 21/743 257/505 |
| 4,835,115 | A * | 5/1989 | Eklund | H01L 21/763 257/510 |
| 6,037,018 | A * | 3/2000 | Jang | C23C 16/402 257/E21.549 |
| 6,080,639 | A * | 6/2000 | Huang | H01L 21/02129 257/E21.275 |
| 6,734,482 | B1 * | 5/2004 | Tran | H01L 27/10814 257/296 |
| 6,861,308 | B2 * | 3/2005 | U'Ren | H01L 21/0237 257/E21.103 |
| 6,872,632 | B2 * | 3/2005 | Ibara | H01L 21/3081 257/E21.232 |
| 2011/0151678 | A1 * | 6/2011 | Ashtiani | H01L 21/76224 438/786 |

(Continued)

*Primary Examiner* — David Vu
(74) *Attorney, Agent, or Firm* — Farjami & Farjami LLP

(57) ABSTRACT

A semiconductor structure having a deep trench isolation structure for improved product yield is disclosed. The semiconductor structure includes a deep trench having a filler material therein. The deep trench is adjacent to field oxide regions in a semiconductor substrate. A high density plasma (HDP) oxide layer, substantially free of thermal oxide, is situated over the filler material in the deep trench. The HDP oxide layer has a substantially co-planar top surface with at least one of the field oxide regions. According to the present disclosure, formation of nodules in the deep trench is prevented.

17 Claims, 8 Drawing Sheets

(56) References Cited

U.S. PATENT DOCUMENTS

| | | | | |
|---|---|---|---|---|
| 2013/0001679 A1* | 1/2013 | Omori | ............... | H01L 21/76897 257/330 |
| 2013/0029465 A1* | 1/2013 | Lee | ................... | H01L 27/10876 438/270 |
| 2013/0140667 A1* | 6/2013 | Kalnitsky | ......... | H01L 21/82348 257/499 |

* cited by examiner

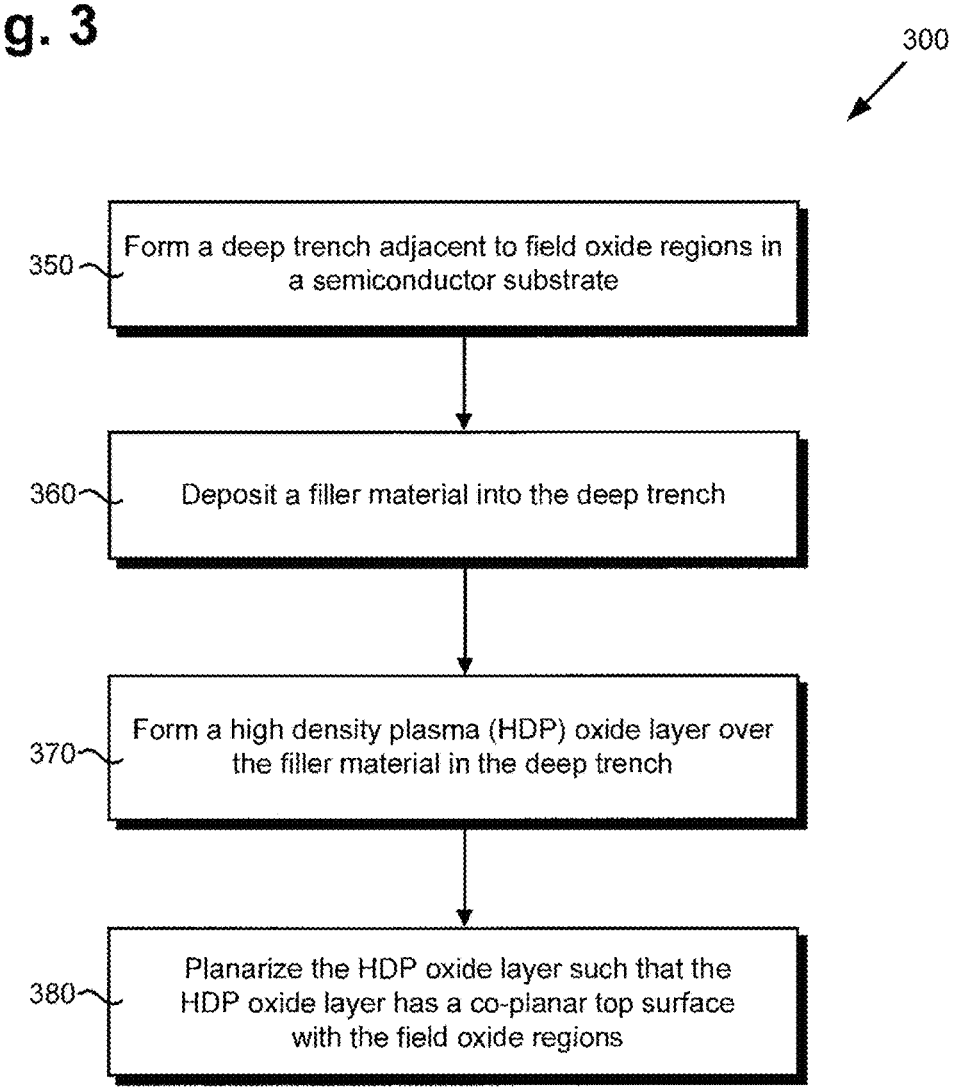

DEEP TRENCH ISOLATION STRUCTURE AND METHOD FOR IMPROVED PRODUCT YIELD

The present application claims the benefit of and priority to a provisional patent application entitled "Deep Trench Isolation Structure and Method for Improved Product Yield," Ser. No. 62/001,537 filed on May 21, 2014. The disclosure in this provisional application is hereby incorporated fully by reference into the present application.

BACKGROUND

In a conventional fabrication process, deep trenches are etched in a semiconductor substrate, lined with oxide, and filled with a filler material. The resulting deep trenches must then be polished and capped off to prevent electrical shorts. During the conventional fabrication process, a deep trench cap oxidation process, such as a thermal oxidation, is performed, where the semiconductor wafer is placed in a high temperature environment so that at least a portion of the filler material is oxidized and converted into a thermal oxide or cap oxide over the top of the deep trench to provide electrical isolation.

During the deep trench cap oxidation process, however, materials formed in and around the deep trench, including the filler material in the deep trench and field oxide material around the deep trench, experience volume expansion in various directions in the semiconductor substrate, resulting in structural deformation around the deep trench and volume displacement stress in the semiconductor substrate. Moreover, due to the volume expansion and structural deformation around the top edges of the deep trench during the deep trench cap oxidation process, additional layers subsequently deposited on the non-flat surfaces in and over the top edges of the deep trenches cannot be completely removed by using, for example, selective etching. Consequently, residues accumulate on the bottom, sidewalls, and top edges of the deep trenches, resulting in large bulges of deep trench nodules.

Deep trench nodules make inspection of trench defects difficult using optical inspection tools. Also, the volume expansion of filler material and field oxide material in and around the deep trenches, after the deep trench cap oxidation process, push and lift up additional layers above the field oxide regions, and cause thermal and mechanical stresses, such as volume expansion displacement stress, in the semiconductor substrate. The volume expansion displacement stress can lead to cracking of the semiconductor substrate, which can result in high leakage current during the operation of the semiconductor devices formed in the semiconductor substrate.

Thus, there is a need in the art for a deep trench isolation structure and method that can effectively eliminate deep trench nodules, and prevent thermal and mechanical stresses in the semiconductor substrate caused by the conventional deep trench cap oxidation process.

SUMMARY

The present disclosure is directed to deep trench isolation structure and method for improved product yield, substantially as shown in and/or described in connection with at least one of the figures, and as set forth in the claims.

BRIEF DESCRIPTION OF THE DRAWINGS

FIG. 3 is a flowchart illustrating a method for fabricating a semiconductor structure according to one implementation of the present application.

DETAILED DESCRIPTION

Figure 1:
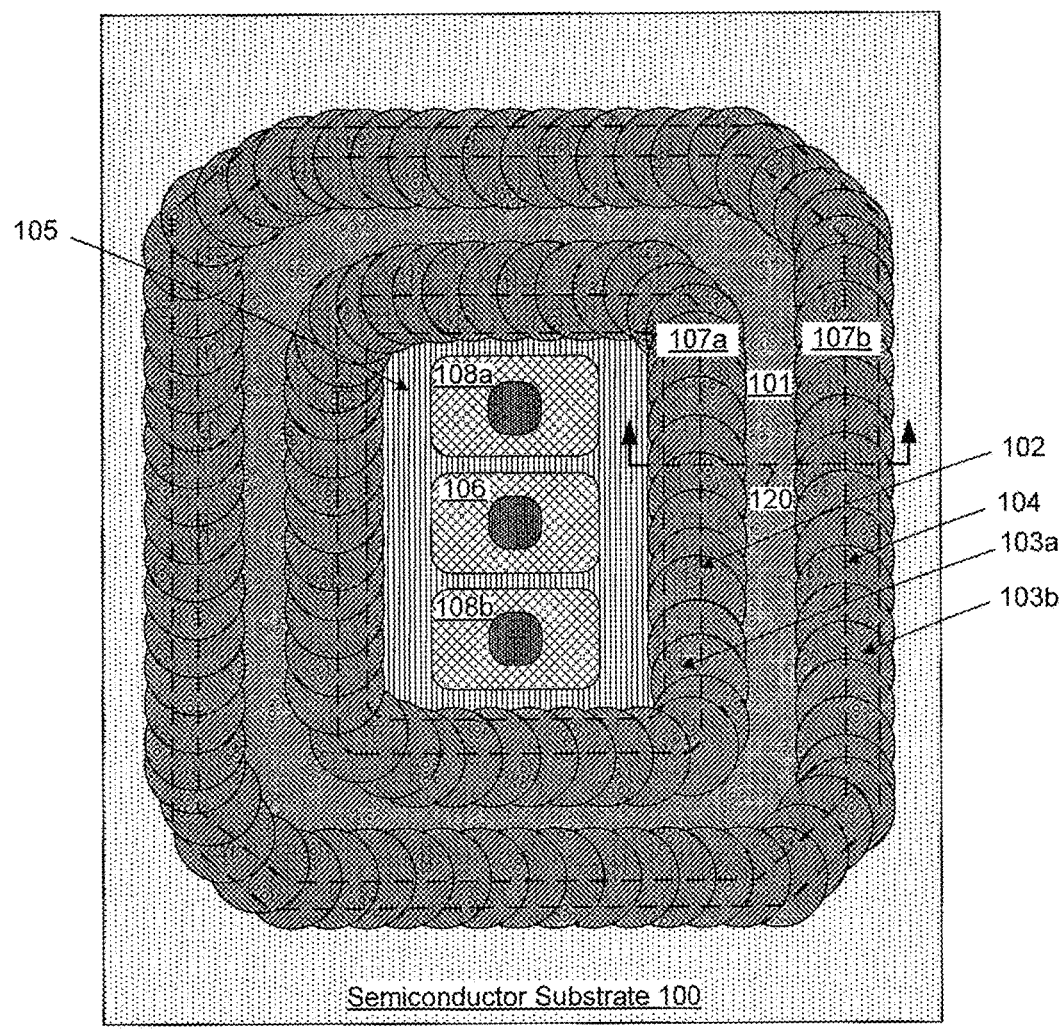
FIG. 1 illustrates a top view of a portion of a conventional semiconductor structure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Referring to FIG. 1, FIG. 1 illustrates a top view of a conventional semiconductor structure with deep trench nodules. The conventional semiconductor structure includes semiconductor substrate 100, deep trench 101 having sidewalls 102 and 104, field oxide regions 103a and 103b, semiconductor device 105 having emitter 106 and collectors 108a and 108b, and deep trench nodules 107a and 107b. As illustrated in FIG. 1, deep trench 101 is formed in semiconductor substrate 100. Deep trench 101 surrounds semiconductor device 105 and provides electrical isolation for semiconductor device 105. Deep trench 101 may include an oxide liner (not explicitly shown in FIG. 1) to line the sidewalls and the bottom of deep trench 101. Deep trench 101 may also include a filler material (not explicitly shown in FIG. 1) within deep trench 101. As illustrated in FIG. 1, semiconductor device 105 is a bipolar device, by way of example. Semiconductor device 105 may include emitter 106 and collectors 108a and 108b, and a base (not explicitly shown in FIG. 1). Semiconductor device 105 is surrounded by field oxide region 103a, deep trench 101 and field oxide region 103b in semiconductor substrate 100. As illustrated in FIG. 1, deep trench nodules 107a and 107b are formed over deep trench 101. The formation of deep trench nodules 107a and 107b will be discussed further below with reference to FIG. 2.

Figure 2:
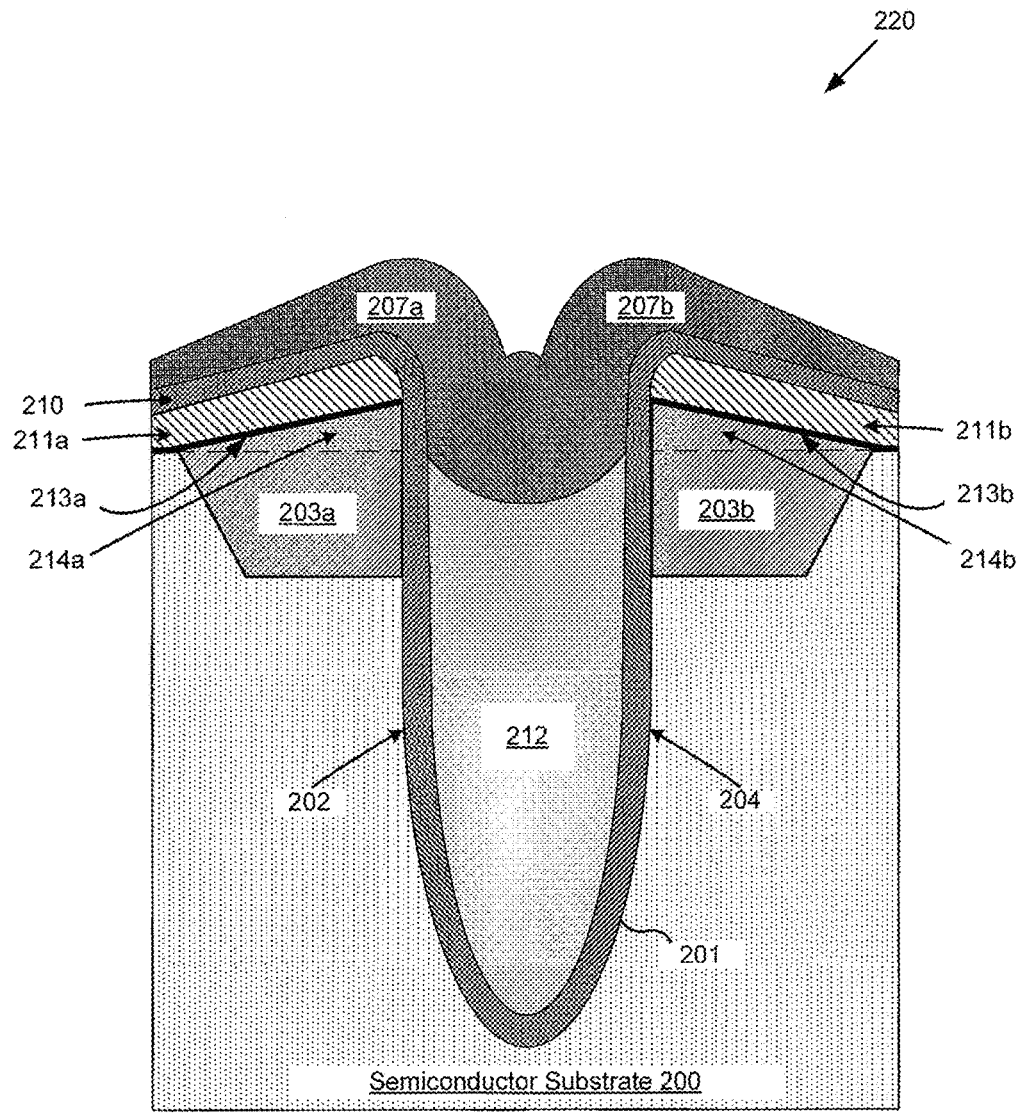
FIG. 2 illustrates a cross-sectional view of a portion of a conventional semiconductor structure.

Referring to FIG. 2, FIG. 2 illustrates a cross-sectional view of the conventional semiconductor structure taken along line 120 in FIG. 1. Semiconductor structure 220 includes semiconductor substrate 200, deep trench 201 having sidewalls 202 and 204, field oxide regions 203a and 203b, deep trench nodules 207a and 207b, oxide liner 210, nitride layers 211a and 211b, filler material 212, stress region 214a having top edge 213a, and stress region 214b having top edge 213b. As illustrated in FIG. 2, deep trench 201 having sidewalls 202 and 204 is formed in semiconductor substrate 200. Oxide liner 210 is formed over semiconductor substrate 200 and in deep trench 201. Field oxide regions 203a and 203b are respectively formed adjacent to sidewalls 202 and 204 of deep trench 201 in semiconductor substrate 200. Nitride layer 211a is formed between oxide liner 210 and field oxide region 203a, and nitride layer 211b is formed between oxide liner 210 and field oxide region 203b.

As illustrated in FIG. 2, field oxide regions 203a and 203b include stress regions 214a and 214b, respectively, as a result of a deep trench cap oxidation process. During the deep trench cap oxidation process, field oxide regions 203a and 203b and filler material 212 experience volume expansion in and around deep trench 201 in semiconductor substrate 200. A top portion of filler material 212 is oxidized and becomes a dielectric material, such as a thermal oxide. For example, stress regions 214a and 214b are the expanded portions of field oxide regions 203a and 203b as a result of the deep trench cap oxidation process.

As can be seen in FIG. 2, field oxide regions 203a and 203b, which include a flat top surface on semiconductor substrate 200 before the oxidation process, expand and push oxide liner 210 and nitride layers 211a and 211b upward during the deep trench cap oxidation process. Stress regions 214a and 214b lift nitride layers 211a and 211b, respectively, to an angle with respect to their horizontal placements before the oxidation process, causing structural deformation to nitride layers 211a and 211b. In addition, oxide liner 210 is also lifted to an angle on each side of deep trench 201 from its horizontal placement over semiconductor substrate 200 prior to the oxidation process. Although FIG. 2 only shows volume expansion of field oxide regions 203a and 203b and filler material 212 in a vertical direction, it is understood that field oxide regions 203a and 203b, filler material 212 and other materials in and around deep trench 201 can also expand in all directions during the deep trench cap oxidation process.

Because of the deep trench cap oxidation process, subsequently deposited layers (e.g., first poly layer, spacer clear layer, SiGe layer, and etc.) formed over the non-flat surface around the top edges of deep trench 201 cannot be completely removed in and around deep trench 201 during subsequent etching processes. The residues result in fence-like structures, such as deep trench nodules 207a and 207b, formed on sidewalls 202 and 204, the bottom and the top edges of deep trench 201. Deep trench nodules 207a and 207b make inspection for defects in the semiconductor wafer extremely difficult using optical inspection tools. In addition, the thermal and mechanical stresses caused by the volume expansion (e.g., 3:1 oxide growth to silicon consumed) during the deep trench cap oxidation process may be concentrated along top edge 213a of stress region 214a and top edge 213b in stress region 214b, which may cause cracking of semiconductor substrate 200.

Cracking has been observed in semiconductor substrates, such as semiconductor substrate 200 (not explicitly shown in FIG. 2), due to the volume expansion displacement stress along top edges of field oxide regions after the deep trench cap oxidation process. A failure analysis is conducted by connecting 200 bipolar devices in parallel and measuring a leakage current from an emitter to a collector. The failure analysis shows an extremely high leakage current due to the formation of cracks in the semiconductor substrate. Thus, the deep trench cap oxidation in the conventional fabrication process not only results in formation of deep trench nodules, but also causes cracking of the semiconductor substrate due to thermal and mechanical stresses.

Referring to FIG. 3, FIG. 3 illustrates an exemplary diagram illustrating an exemplary method according to an implementation of the present inventive concepts. Certain details and features have been left out of flowchart 300 that are apparent to a person of ordinary skill in the art. For example, an action may consist of one or more sub actions or may involve specialized equipment or materials, as known in the art. Actions 350 through 380 indicated in flowchart 300 are sufficient to describe one implementation of the present inventive concepts, other implementations of the present inventive concepts may utilize actions different from those shown in flowchart 300. As illustrated in flowchart 300, action 350 includes forming a deep trench adjacent to field oxide regions in a semiconductor substrate. Action 360 includes depositing a filler material into the deep trench. Action 370 includes forming a high density plasma (HDP) oxide layer over the filler material in the deep trench. Action 380 includes planarizing the HDP oxide layer such that the HDP oxide layer has a co-planar top surface with the field oxide regions.

Figure 4A:
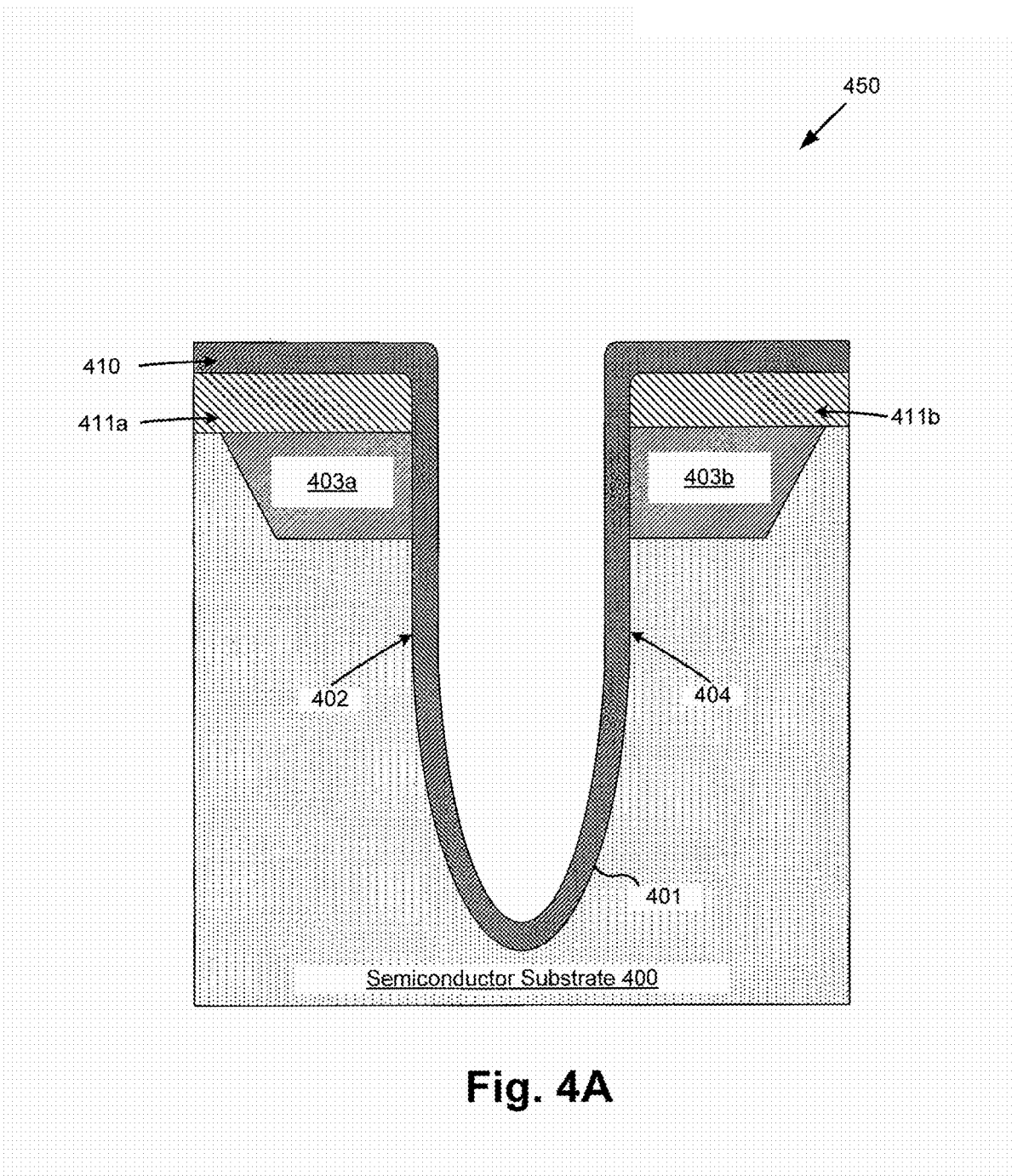
FIG. 4A illustrates a cross-sectional view of a portion of a semiconductor structure processed in accordance with an initial action in the flowchart of FIG. 3 according to one implementation of the present application.
Figure 4B:
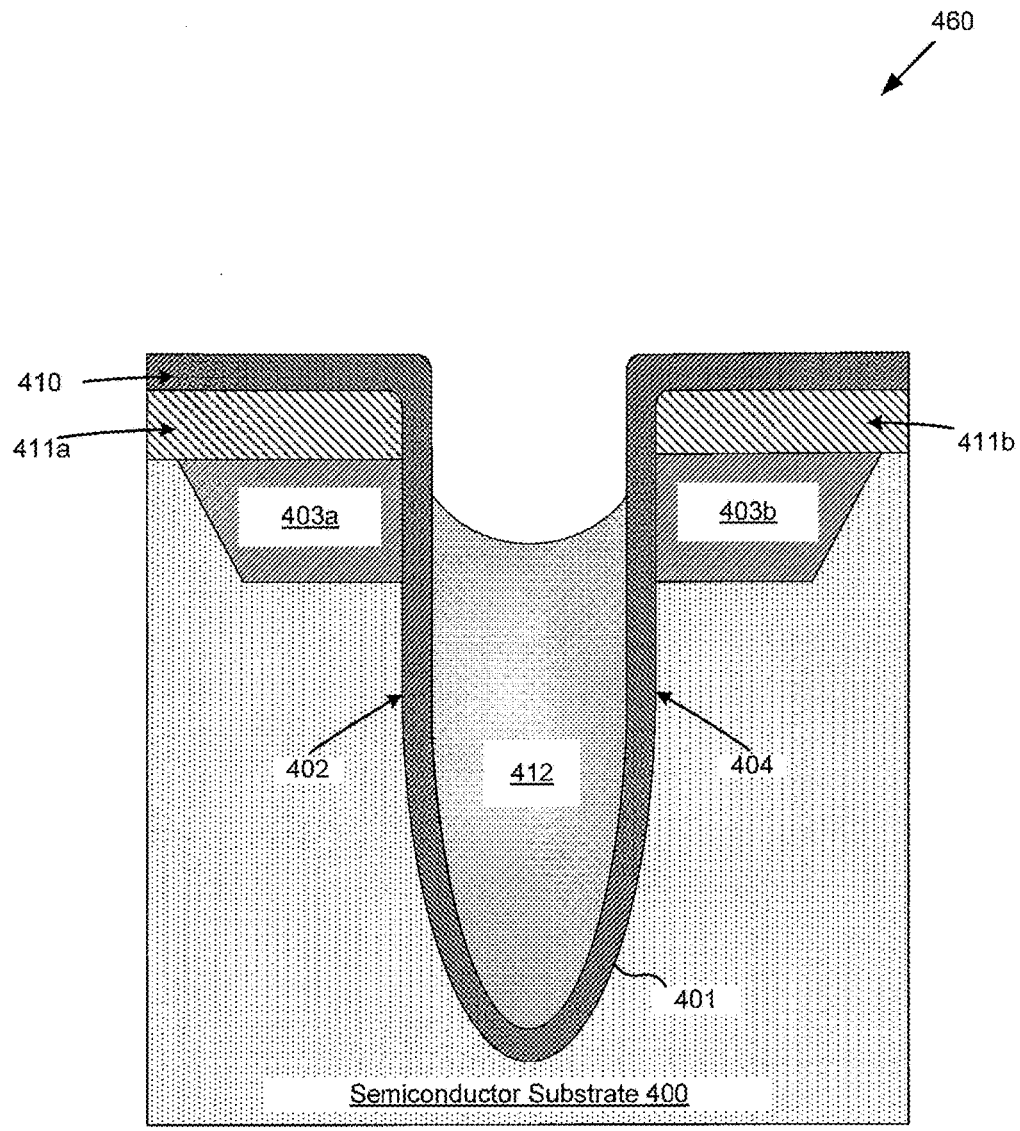
FIG. 4B illustrates a cross-sectional view of a portion of a semiconductor structure processed in accordance with an intermediate action in the flowchart of FIG. 3 according to one implementation of the present application.
Figure 4C:
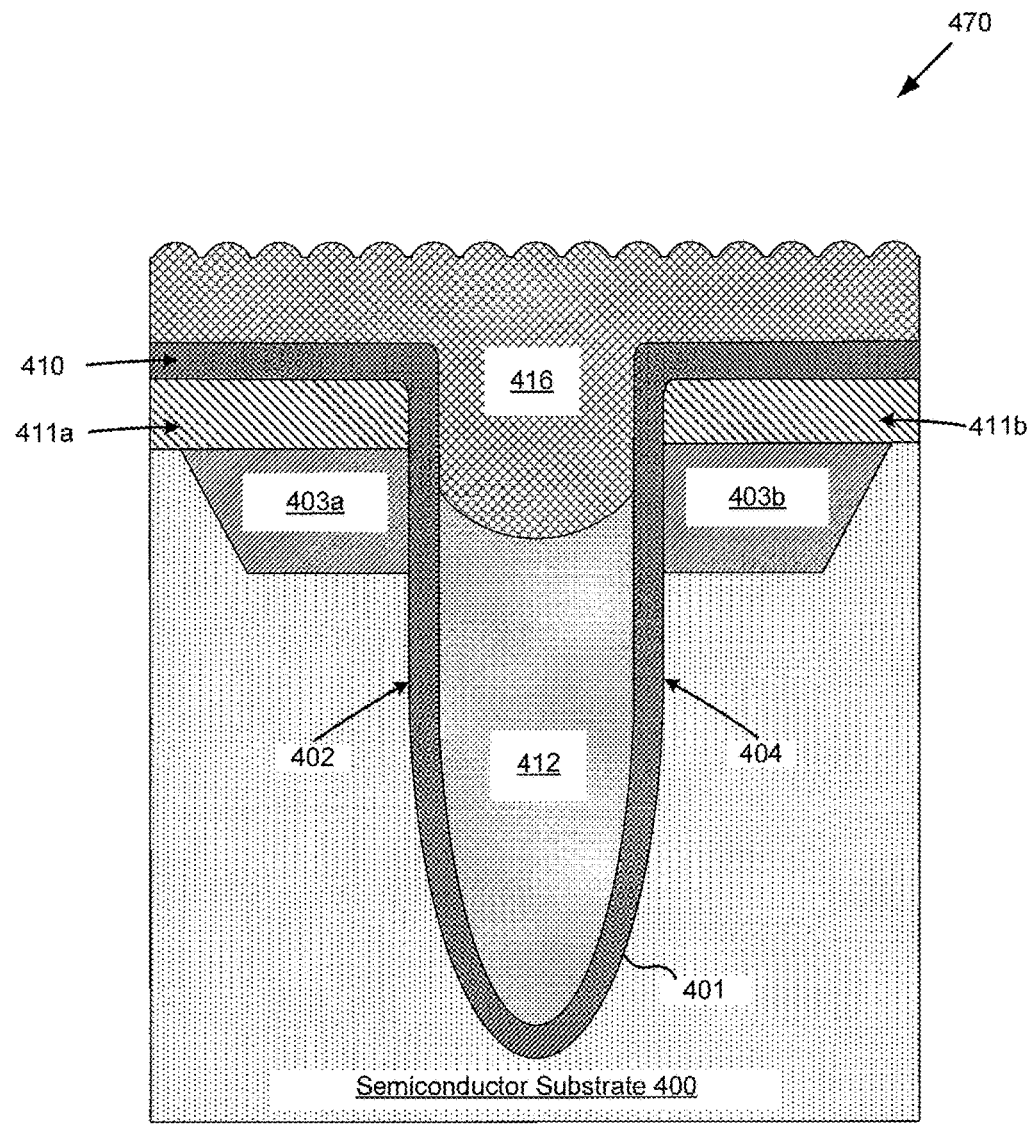
FIG. 4C illustrates a cross-sectional view of a portion of a semiconductor structure processed in accordance with an intermediate action in the flowchart of FIG. 3 according to one implementation of the present application.
Figure 4D:
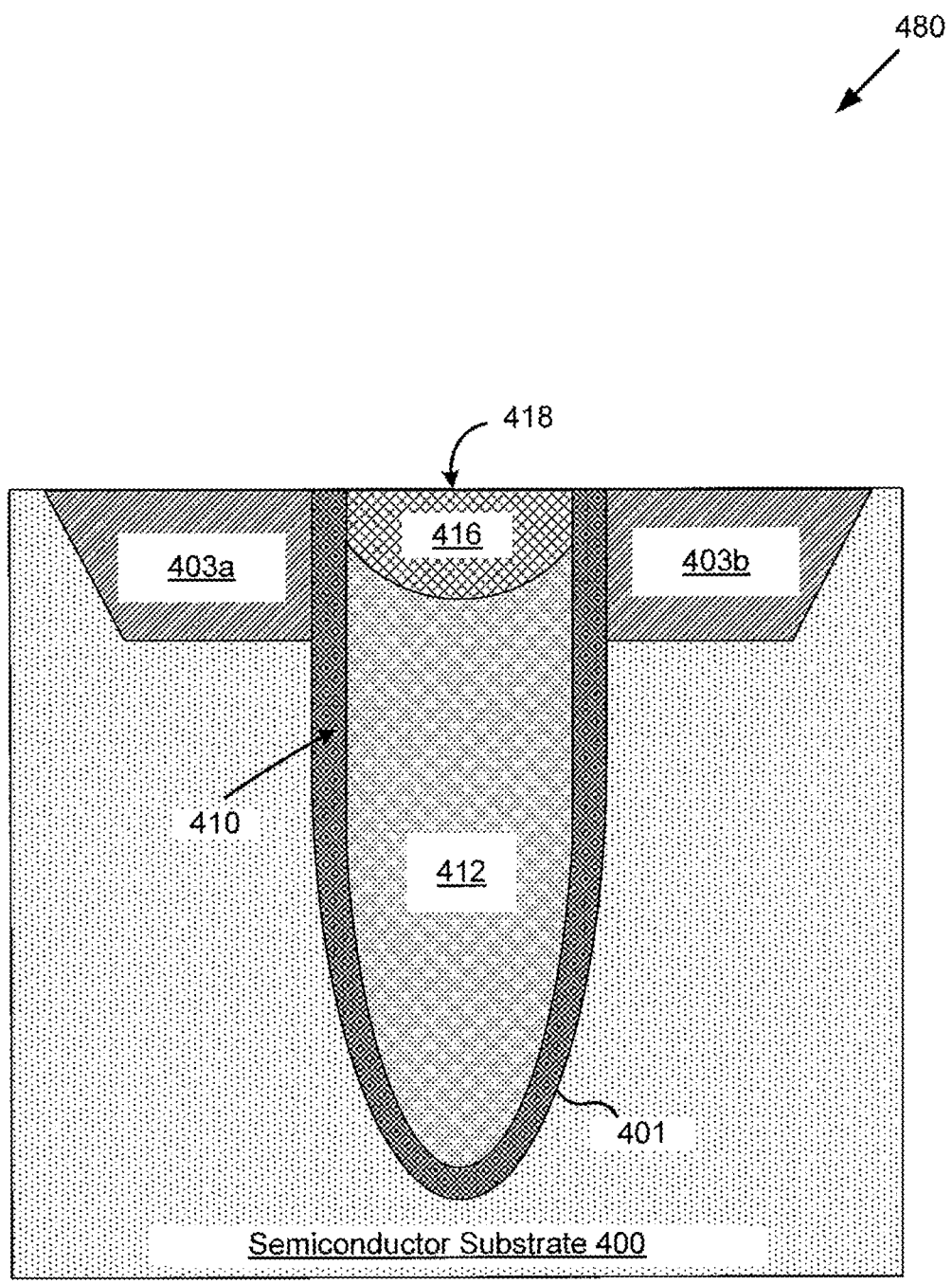
FIG. 4D illustrates a cross-sectional view of a portion of a semiconductor structure processed in accordance with a final action in the flowchart of FIG. 3 according to one implementation of the present application.

FIGS. 4A through 4D illustrate the result of performing actions 350 through 380 of flowchart 300, respectively. For example, FIG. 4A shows semiconductor structure 450 after processing action 350. FIG. 4B shows semiconductor structure 450 in FIG. 4A after the processing of action 360. FIG. 4C shows semiconductor structure 460 in FIG. 4B after the processing of action 370. FIG. 4D shows semiconductor structure 470 in FIG. 4C after the processing of action 380.

Referring to FIG. 4A, FIG. 4A shows an exemplary semiconductor structure having semiconductor structure having a deep trench adjacent to field oxide regions in a semiconductor substrate after completion of action 350 of flowchart 300 in FIG. 3. As illustrated in FIG. 4A, semiconductor structure 450 includes semiconductor substrate 400, deep trench 401 having sidewalls 402 and 404, field oxide regions 403a and 403b, nitride layers 411a and 411b, and oxide liner 410. Semiconductor substrate 400 may include silicon, silicon germanium, germanium, or other appropriate substrate material. Field oxide regions 403a and 403b may include silicon oxide or other appropriate oxide material to provide isolation for an active region of a semiconductor device (not explicitly shown in FIG. 4A).

In the present implementation, deep trench 401 is formed by for example, etching through field oxide regions 403a and 403b into semiconductor substrate 400. As illustrated in FIG. 4A, deep trench 401 includes tapered sidewalls and a round bottom. In another implementation, deep trench 401 may include vertical sidewalls and/or a flat bottom surface. As illustrated in FIG. 4A, deep trench 401 is formed adjacent to field oxide regions 403a and 403b, and extends into semiconductor substrate 400. In the present implementation, deep trench 401 has a depth of 7 microns, by way of example. As further illustrated in FIG. 4A, oxide liner 410 is formed on the bottom and along sidewalls 402 and 404 of deep trench 401. Oxide liner 410 is formed over the top edges of deep trench 401. In one implementation, oxide liner 410 includes a tetraethylorthosilicate (TEOS) liner. Nitride layers 411a and 411b, which may be portions of a spacer nitride layer (e.g., a silicon nitride layer) over semiconductor substrate 400, are formed between oxide liner 410 and field oxide region 403a, and oxide liner 410 and field oxide region 403b, respectively.

Referring to FIG. 4B, FIG. 4B shows an exemplary semiconductor structure having a filler material deposited into a deep trench after completion of action 360 of flowchart 300 in FIG. 3. As illustrated in FIG. 4B, semiconductor structure 460 includes semiconductor substrate 400, deep trench 401 having sidewalls 402 and 404, field oxide regions 403a and 403b, nitride layers 411a and 411b, oxide liner 410, and filler material 412. In an implementation, filler material 412 is deposited by low pressure chemical vapor deposition (LPCVD), for example. In the present implementation, filler material 412 includes polysilicon. In another implementation, filler material 412 may include metallic material, such as titanium, tungsten, or any other suitable electrically conductive metallic filler or metallic filler stack. In yet another implementation, filler material 412 may include dielectric material, such as silicon oxide.

Referring to FIG. 4C, FIG. 4C shows an exemplary semiconductor structure having a high density plasma (HDP) oxide layer formed over a filler material in a deep trench after completion of action 370 of flowchart 300 in FIG. 3. As illustrated in FIG. 4C, semiconductor structure 470 includes semiconductor substrate 400, deep trench 401 having sidewalls 402 and 404, field oxide regions 403a and 403b, nitride layers 411a and 411b, oxide liner 410, filler material 412, and HDP oxide layer 416. HDP oxide layer 416 is a plasma deposited HDP film with good gap fill capability. As illustrated in FIG. 4C, HDP oxide layer 416 is deposited inside deep trench 401 over filler material 412, and over a top surface of oxide liner 410. In the present implementation, HDP oxide layer 416 includes the same material as that of field oxide regions 403a and 403b, such as silicon oxide. In other implementations, HDP oxide layer 416 may include other appropriate oxide material.

Notably, in a departure from conventional processes, instead of performing a deep trench cap oxidation process, the present implementation utilizes the HDP oxide deposition over the top of the deep trench. Since the deep trench cap oxidation process is not performed, HDP oxide layer 416 is free of thermal oxide. Moreover, field oxide regions 403a and 403b, and filler material 412 do not experience volume expansion or deformation. As illustrated in FIG. 4C, field oxide regions 403a and 403b, nitride layers 411a and 411b, oxide liner 410, filler material 412 remains substantially unaltered after the deposition of HDP oxide layer 416. As such, thermal and mechanical stresses that would have been resulted in a semiconductor wafer, such as stress regions 214a and 214b and regions under field oxide regions 203a and 203b in FIG. 2, during the deep trench cap oxidation process is advantageously eliminated. Since HDP oxide layer 416 is free of thermal oxide, cracking in semiconductor substrate 400 is also prevented. In addition, because the deep trench cap oxidation process is not performed, a cap oxidization pre-clean process can be eliminated, thereby reducing cost and time in the fabrication process.

Referring to FIG. 4D, FIG. 4D shows an exemplary semiconductor structure having a planarized HDP oxide layer in a deep trench, the planarized HDP oxide layer having a co-planar top surface with field oxide regions adjacent to the deep trench after completion of action 380 of flowchart 300 in FIG. 3. As illustrated in FIG. 4D, semiconductor structure 480 includes semiconductor substrate 400, deep trench 401 having sidewalls 402 and 404, field oxide regions 403a and 403b, oxide liner 410, filler material 412, and HDP oxide layer 416. The excess HDP oxide layer 416 as appeared in semiconductor structure 470 in FIG. 4C is removed by, for example, a chemical-mechanical polishing (CMP) process.

As illustrated in FIG. 4D, nitride layers 411a and 411b, and portions of oxide liner 410 over the top of semiconductor substrate 400 as appeared in FIG. 4C are also removed during by the CMP process. As such, HDP oxide layer 416 has co-planar top surface 418 with oxide liner 410 and field oxide regions 403a and 403b in semiconductor structure 480. In another implementation, a CMP process removes only portions of the oxide liner (e.g., portions of oxide liner 410 in FIG. 4C) and leaves the nitride layers (e.g., nitride layers 411a and 411b in FIG. 4C) substantially unaltered. As such, HDP oxide layer 416 has a co-planar top surface with the nitride layers situated above the field oxide regions. By using the CMP process, particles introduced during the deposition and removal of nitride and/or polysilicon (e.g., nitride layers 411a and 411b, and filler material 412 in FIG. 4C) can be effectively removed from the semiconductor structure, which cannot be removed by conventional fabrication processes.

Thus, according the present inventive concepts, the planarized HDP oxide layer 416 acts as a capping layer over filler material 412. In contrast to the deep trench cap oxidation process, the present implementation results in zero volume growth of field oxide regions 403a and 403b, and advantageously eliminates the formation of deep trench nodules and thermal and mechanical stresses in semiconductor substrate 400. As can be seen in FIG. 4D, field oxide regions 403a and 403b each have a flat top surface.

Figure 5:
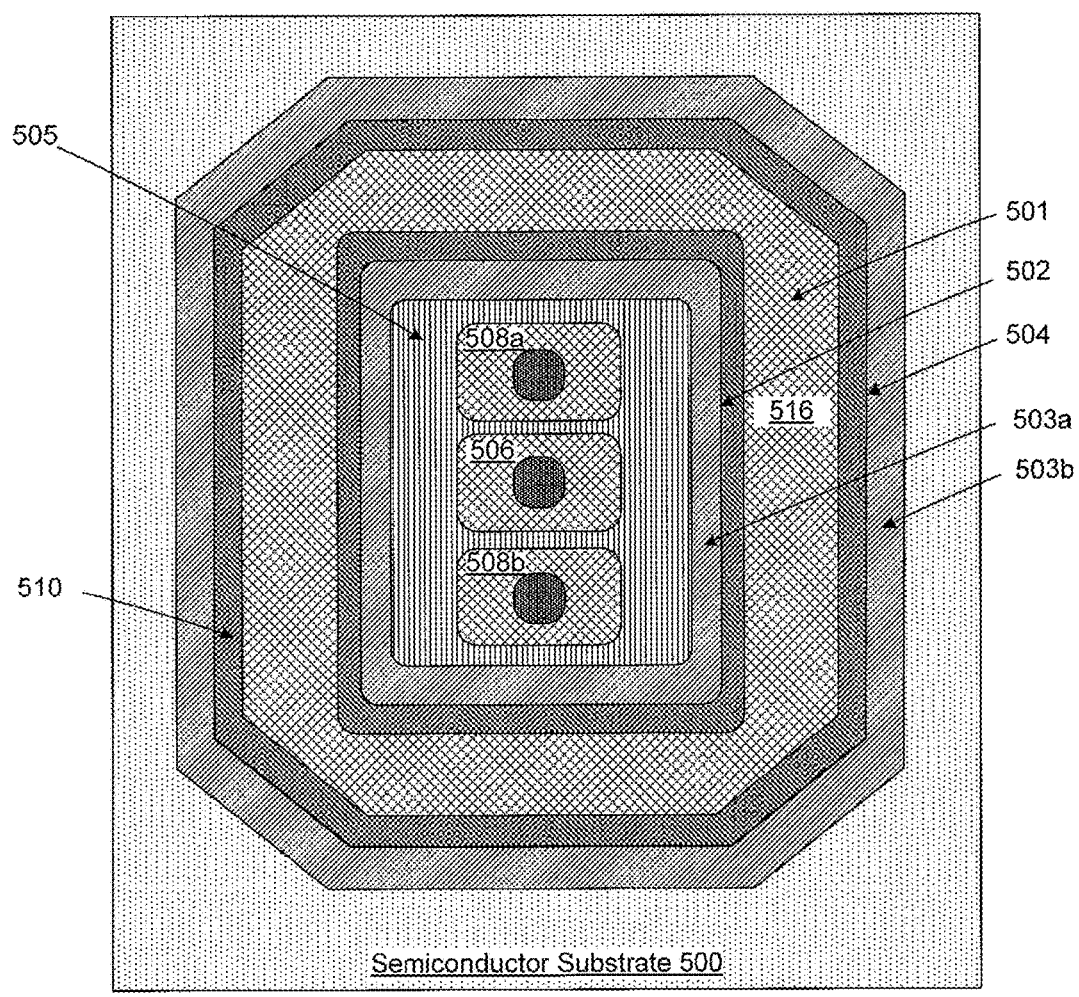
FIG. 5 illustrates a top view of a portion of a semiconductor structure according to one implementation of the present application.

Referring to FIG. 5, FIG. 5 shows a top view of an exemplary structure according to an implementation of the present inventive concepts. The semiconductor structure includes semiconductor substrate 500, deep trench 501 having sidewalls 502 and 504, field oxide regions 503a and 503b, semiconductor device 505 having emitter 506 and collectors 508a and 508b. As illustrated in FIG. 5, deep trench 501 is formed in semiconductor substrate 500. Deep trench 501 surrounds semiconductor device 505 and provides electrical isolation for semiconductor device 505. Deep trench 501 includes oxide liner 510 lining the sidewalls and the bottom of the deep trench. Deep trench 501 may include a filler material, not explicitly shown in FIG. 5, below HDP oxide layer 516. As illustrated in FIG. 5, semiconductor device 505, which may be bipolar device, includes emitter 506 and collectors 508a and 508b, and a base (not explicitly shown in FIG. 5), and is surrounded by field oxide region 503a, deep trench 501 and field oxide region 503b in semiconductor substrate 500.

As compared to the semiconductor device in FIG. 1, the semiconductor device in FIG. 5 shows a smooth top planar surface (e.g., co-planar top surface 418 in FIG. 4D) without deep trench nodules. In addition, because a thermal oxidation of a polysilicon material in a deep trench is not performed, the semiconductor device in FIG. 5 results in zero growth of field oxide regions 503a and 503b, and zero volume displacement stress in semiconductor substrate 500.

Thus, the present inventive concepts utilize an HDP deposition to deposit an HDP oxide layer with good gap fill capability inside a deep trench and on a top surface of a semiconductor wafer to confine and electrical isolate a filler material in the deep trench. The HDP oxide layer is planarized using, for example, a CMP process so that the HDP oxide layer has a co-planar top surface with field oxide regions adjacent to the deep trench. The CMP process effectively removes any particles introduced during nitride and/or polysilicon deposition and removal from the semiconductor wafer. Because the deep trench cap oxidation is not performed, the field oxide regions, the nitride layers, the oxide liner, and filler material in the deep trench remain substantially unaltered during and after the deposition of the HDP oxide layer, thereby preventing the formation of deep trench nodules and eliminating deformation and thermal and mechanical stresses in the semiconductor substrate. Thus, thermal and mechanical stresses that would have been resulted above and under field oxide regions in a semiconductor wafer as a result of the deep trench cap oxidation process are advantageously eliminated. As thermal and mechanical stresses, such as volume expansion displacement stress, are effectively eliminated, leakage currents due to cracking in semiconductor substrates are also advantageously avoided, thereby resulting in better product yield.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive, it should also be understood that the present application is not limited to the particular implementations described above, but many rearrangements, modifications, and substitutions are possible without departing from the scope of the present disclosure.

The invention claimed is:

1. A semiconductor structure comprising:
   a deep trench adjacent to field oxide regions in a semiconductor substrate;
   an electrically conductive metallic filler material in said deep trench;
   a high density plasma (HDP) oxide layer, free of thermal oxide, in said deep trench and situated directly over said electrically conductive metallic filler material, wherein said HDP oxide layer does not reach a bottom of said deep trench, interfaces with said electrically conductive metallic filler adjacent to at least one of said field oxide regions, and has a substantially co-planar top surface with said semiconductor substrate and at least one of said field oxide regions, thereby preventing nodules in said deep trench;
   wherein a semiconductor device is surrounded and enclosed by said electrically conductive metallic filler and said HDP oxide layer.

2. The semiconductor structure of claim 1, wherein said HDP oxide layer, free of thermal oxide, prevents stress under said field oxide regions in said semiconductor substrate.

3. The semiconductor structure of claim 1, wherein said HDP oxide layer, free of thermal oxide, prevents cracking in said semiconductor substrate.

4. The semiconductor structure of claim 1, wherein said HDP oxide layer comprises silicon oxide.

5. The semiconductor structure of claim 1, further comprising an oxide liner in said deep trench.

6. The semiconductor structure of claim 5, wherein said oxide liner comprises a tetraethylorthosilicate (TEOS) liner.

7. The semiconductor structure of claim 5, wherein said oxide liner has a co-planar top surface with said field oxide regions and said HDP oxide layer.

8. The semiconductor structure of claim 1, wherein said deep trench provides electrical isolation for said semiconductor device.

9. A method comprising:
   forming a deep trench adjacent to a field oxide region in a semiconductor substrate;
   depositing an electrically conductive metallic filler material into said deep trench;
   forming a high density plasma (HDP) oxide layer in said deep trench and directly over said electrically conductive metallic filler material, wherein said HDP oxide layer does not reach a bottom of said deep trench, and interfaces with said electrically conductive metallic filler adjacent to said field oxide region;
   planarizing said HDP oxide layer such that said HDP oxide layer has a co-planar top surface with said semiconductor substrate and said field oxide region;
   wherein a semiconductor device is surrounded and enclosed by said electrically conductive metallic filler and said HDP oxide layer.

10. The method of claim 9, wherein said HDP oxide layer is formed while substantially avoiding thermal oxidation.

11. The method of claim 9, wherein said HDP oxide layer is formed without causing thermal oxidation.

12. The method of claim 9, wherein said planarizing comprises chemical mechanical polishing.

13. The method of claim 9, wherein said HDP oxide layer comprises silicon oxide.

14. The method of claim 9, further comprising depositing an oxide liner in said deep trench prior to said depositing said electrically conductive metallic filler material.

15. The method of claim 14, wherein said oxide liner comprises a tetraethylorthosilicate (TEOS) liner.

16. The method of claim 14, wherein said oxide liner has a co-planar top surface with said field oxide region and said HDP oxide layer.

17. The method of claim 9, wherein said deep trench provides electrical isolation for said semiconductor device.

* * * * *